United States Patent [19]
Okada

[11] Patent Number: 4,546,330
[45] Date of Patent: Oct. 8, 1985

[54] PHASE-LOCKED LOOP CIRCUIT

[75] Inventor: Toshiro Okada, Machida, Japan

[73] Assignee: Fujitsu Limited, Kawasaki, Japan

[21] Appl. No.: 462,112

[22] Filed: Jan. 28, 1983

[30] Foreign Application Priority Data

Jan. 28, 1982 [JP] Japan ............................ 57-12116

[51] Int. Cl.$^4$ ............................................. H03L 7/00
[52] U.S. Cl. ...................................... 331/17; 331/1 A; 331/25
[58] Field of Search .................. 307/510, 511, 514; 328/133, 134, 155; 331/1 A, 16, 17, 25

[56] References Cited

U.S. PATENT DOCUMENTS

| 4,156,855 | 5/1979 | Crowley | 331/17 X |
| 4,167,711 | 9/1979 | Smoot | 331/17 |
| 4,400,667 | 8/1983 | Belkin | 331/1 A |
| 4,433,308 | 2/1984 | Hirata | 331/17 |

Primary Examiner—Eugene R. LaRoche
Assistant Examiner—Robert J. Pascal
Attorney, Agent, or Firm—Staas & Halsey

[57] ABSTRACT

A phase-locked loop circuit comprises a voltage-controlled oscillator (11), a phase comparator (13), a low-pass filter (15), a plurality of pump circuits (14S, 14F, . . . ), and a selecting circuit ($G_{45}$) for selecting one of the pump circuits. The low-pass filter is comprised of a capacitor (C) and a plurality of resistors ($R_1$ to $R_3$) each connected to one of the pump circuits. By selecting one of the pump circuits to connect to a corresponding resistor, the cutoff frequency or time constant of the low-pass filter is switched in multi-steps.

4 Claims, 16 Drawing Figures

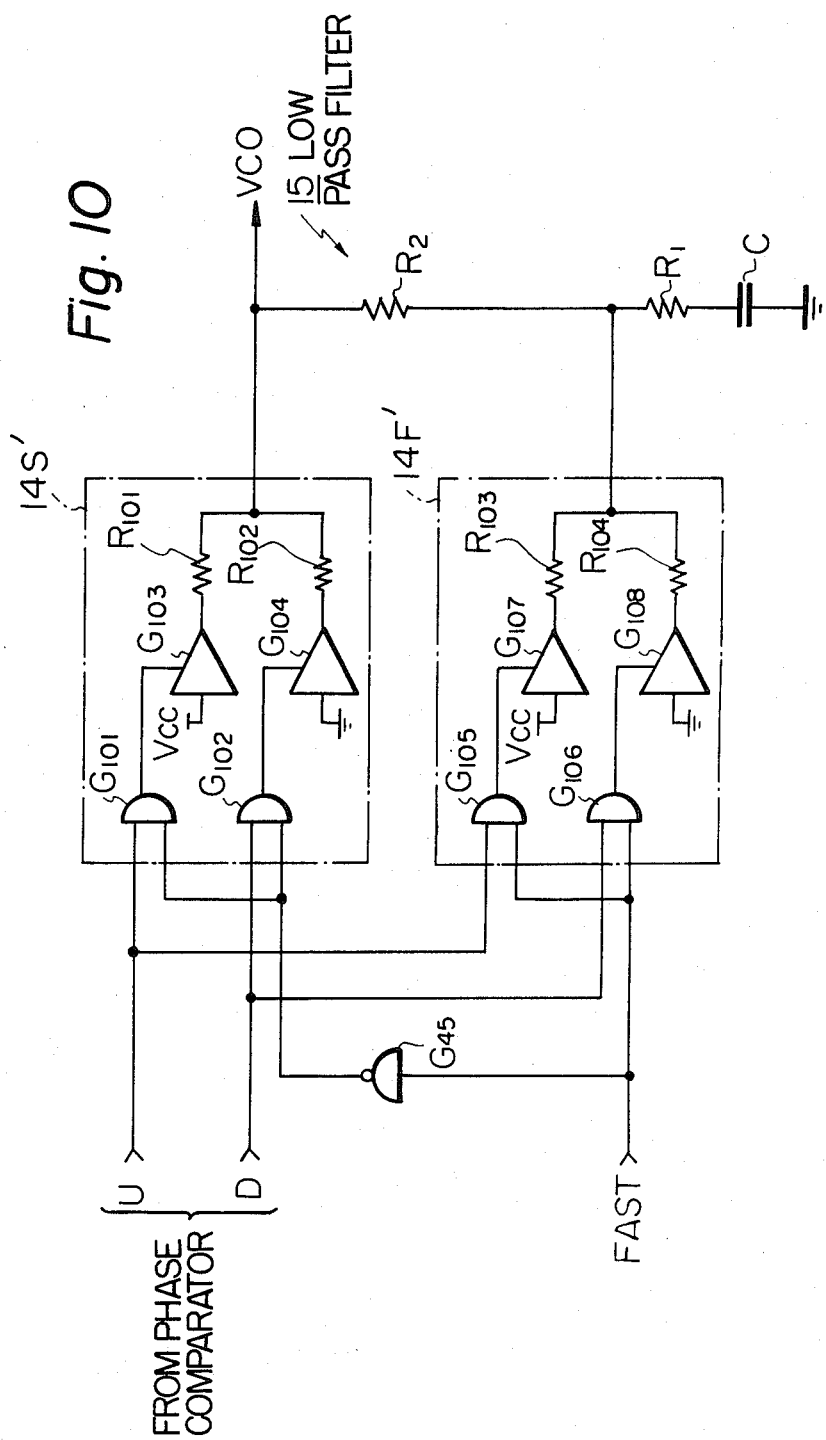

PHASE-LOCKED LOOP CIRCUIT

BACKGROUND OF THE INVENTION

1. Field of the Invention

The present invention relates to a phase-locked loop (PLL) circuit in which the cutoff frequency or time constant of a low-pass filter is switched in multi-steps.

2. Description of the Prior Art

A PLL circuit is often used in communication systems, computer systems, and the like. For example, in order to read digital data out of a magnetic disk, a clock signal is necessary. Generally, the clock signal is extracted from the read data itself, and a PLL circuit is used as a clock extracting circuit.

A conventional PLL circuit comprises a voltage-controlled-oscillator, a phase comparator, and a low-pass filter associated with a pump circuit. The characteristics of such a PLL circuit must be such that the PLL circuit does not change with rapid fluctuation, such as jitter, included in an input signal after the PLL circuit locks with the input signal, i.e., after the feedback nature of the PLL circuit causes the voltage-controlled oscillator to synchronize with the input signal. To make certain that the stability of the PLL circuit does not deteriorate, the cutoff frequency of the low-pass filter is made high during the lock-in mode so as to enhance the response time of the PLL circuit. The cutoff frequency of the low-pass filter is made low after the lock-in mode so as to reduce the response time of the PLL circuit.

In the prior art, however, in order to switch the cutoff frequency of the low-pass filter, a switching transistor is provided within the low-pass filter, and, as a result, the saturated voltage of the transistor is applied as noise to the control voltage of the voltage-controlled oscillator during the lock-in mode, thereby deteriorating the characteristics of the PLL circuit.

SUMMARY OF THE INVENTION

It is an object of the present invention to provide a PLL circuit in which the cutoff frequency of a low-pass filter can be switched without using a switching transistor.

According to the present invention, a low-pass filter is comprised of a capacitor and a plurality of resistors connected in series. In addition, a plurality of pump circuits, which are the same in number as the above-mentioned resistors, are connected thereto. By selecting one of the pump circuits, the cutoff frequency of the low-pass filter is switched in multi-steps.

BRIEF DESCRIPTION OF THE DRAWINGS

The present invention will be more clearly understood from the description set forth below, in which the present invention is contrasted with the prior art and reference is made to the accompanying drawings, wherein:

FIG. 10 is a circuit diagram of a second embodiment of a portion of the PLL circuit according to the present invention;

DESCRIPTION OF THE PREFERRED EMBODIMENTS

Figure 1:
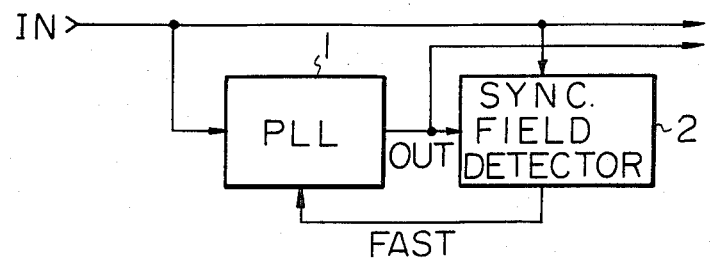
FIG. 1 is a block diagram of a general magnetic disk system.

In FIG. 1, which is a magnetic disk system, a read signal or an input signal IN from a magnetic head (not shown) is supplied to a PLL circiut 1, which generates a synchronizing clock signal or an output signal OUT. The output signal OUT is supplied to a synchronous field detector 2, which detects a synchronous field which is located before or after each piece of data. The synchronous field detector 2 generates a control signal FAST to switch the response time of the PLL circuit 1, depending on whether or not the PLL circuit 1 locks with the input signal IN. Note that the actual data is reproduced by the input signal IN and the output signal OUT at a subsequent circuit (not shown). The PLL circuit 1 will now be explained in more detail.

Figure 2:
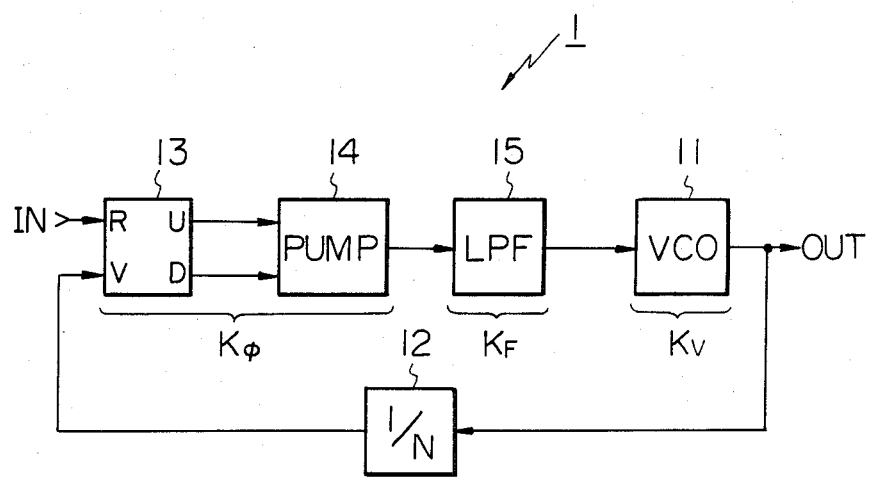
FIG. 2 is a block diagram of a general PLL circuit.

In FIG. 2, which is a general PLL circuit, reference numeral 11 designates a voltage-controlled oscillator in which the free-running frequency is set to N times the frequency of the input signal IN; 12 designates a frequency divider, i.e., a counter, which may be omitted, for dividing the output signal OUT of the voltage-controlled oscillator 11 into 1/N; and 13 designates a phase comparator for phase comparing the output signal of the frequency divider 12 with the input signal IN. That is, the phase comparator 13 generates a pump-up output U or a pump-down output D to a pump circuit 14, depending on whether the input signal IN leads or lags behind the output signal OUT of the frequency divider 12. The pump circuit 14 charges a low-pass filter 15 upon receipt of the pump-up output U of the phase comparator 13 and discharges the low-pass filter 15 upon receipt of the pump-down output D of the phase comparator 13. The oscillating frequency of the voltage-controlled oscillator 11 is controlled by the direct-current output of the low-pass filter 15.

The characteristics of the PLL circuit 1 must be such that the PLL circuit 1 does not change with rapid fluctuation, such as jitter, included in the input signal IN after a lock-in operation is performed so as to lock the frequency of the voltage-controlled oscillator 11 with the input signal IN from the magnetic head. To make certain that the stability of the PLL circuit does not deteriorate, generally, the cutoff frequency of the low-pass filter 15 is made high during the lock-in mode so as to enhance the response time of the PLL circuit. The cutoff frequency of the low-pass filter 15 is made low after the lock-in mode so as to reduce the response time of the PLL circuit 1. Thus, the cutoff frequency or time constant of the low-pass filter 15 is switched so that the PLL circuit 1 changes only with fluctuation of the rotational disk, not with fluctuation, such as jitter, included in the input signal IN.

In FIG. 2, if it is assumed that the entire gain of the phase comparator 13 and the pump circuit 14 is $K_\phi$(V/rad), the gain of the low-pass filter 15 is $K_F$, the gain of the voltage-controlled oscillator 11 is $K_v$ (rad/sec/V), the division ratio of the frequency divider 12 is N, the phase of the output signal OUT is $\theta_0$ (s), the phase of the input signal IN is $\theta_i$ (s), and s is a Laplace operator, then $$\frac{\theta_o(s)}{\theta_i(s)} = \frac{K_\phi \cdot K_F \cdot K_V}{S + \frac{K_\phi \cdot K_F \cdot K_V}{N}} \quad (1)$$

Figure 3:
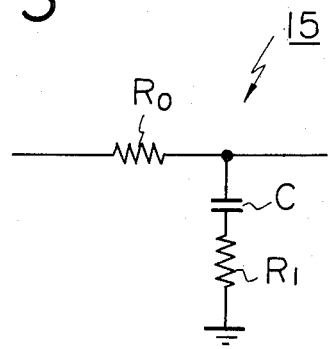
FIG. 3 is a circuit diagram of the low-pass filter of FIG. 2.

If the low-pass filter 15 is a passive filter having a primary delay and consists of resistors $R_0$ and $R_1$ and a capacitor C as shown in FIG. 3, then the gain $K_F$ of the low-pass filter 15 is represented by $$K_F = \frac{R_1 + \frac{1}{sC}}{R_0 + R_1 + \frac{1}{sC}} = \frac{sCR_1 + 1}{sC(R_0 + R_1) + 1} \quad (2)$$

Therefor, from the formulae (1) and (2), $$\frac{\theta_o(s)}{\theta_i(s)} = \frac{K_\phi \cdot K_F \cdot K_V}{s + \frac{K_\phi \cdot K_F \cdot K_V}{N}} \quad (3)$$

$$= \frac{K_\phi \cdot K_V \cdot \frac{sCR_1 + 1}{sC(R_0 + R_1) + 1}}{s + \frac{K_\phi \cdot K_V \cdot \frac{sCR_1 + 1}{sC(R_0 + R_1) + 1}}{N}}$$

$$= \frac{K_\phi \cdot K_V \cdot N(sCR_1 + 1)}{s^2 NC(R_0 + R_1) + s(K_\phi \cdot K_V \cdot CR_1 + N) + K_\phi \cdot K_V}$$

In the formula (3), if it is assume that the denominator=0, then the characteristic equation is as follows:

$$0 = s^2 NC(R_0 + R_1) + (K_\phi \cdot K_V \cdot C \cdot R_1 + N) + K_\phi \cdot K_V \quad (4)$$

This formula (4) can be replaced by $$0 = s^2 + 2\xi \cdot \omega_n \cdot s + \omega_n^2$$

where $$\omega_n = \sqrt{\frac{K_\phi \cdot K_V}{NC(R_0 + R_1)}} \quad (5)$$

$$\xi = \frac{K_\phi \cdot K_V \cdot C \cdot R_1 + N}{\sqrt{R_1 + R_0}} \cdot \frac{1}{2\sqrt{K_\phi \cdot K_V \cdot N \cdot C}} \quad (6)$$

Note that $\omega_n$ and $\xi$ are called natural angular frequency and dumping factor, respectively.

According to the formulae (5) and (6), if the resistors $R_0$ and $R_1$ are variable, $\omega_n$ is small if ($R_0 + R_1$) is large. In addition, in order to stabilize the PLL circuit 1, $\xi$ should be definite, and, accordingly, $R_0$ should be large if $R_1$ is large.

Figure 4:
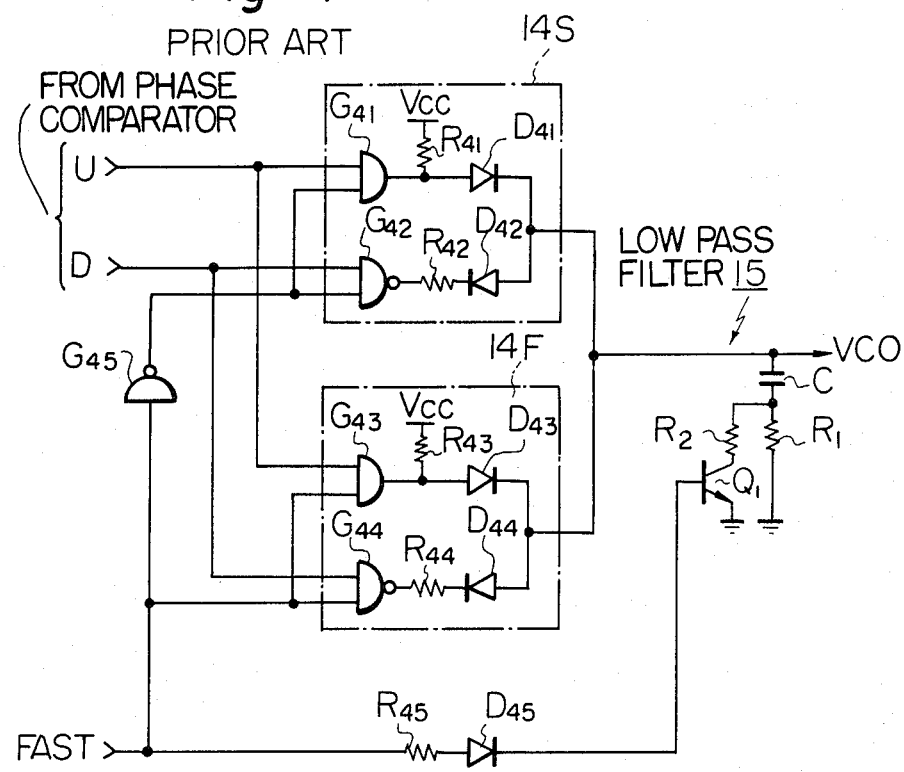
FIG. 4 is a circuit diagram of a portion of a prior art PLL circuit.

FIG. 4 is a portion of the PLL circuit in FIG. 2 in which the cutoff frequency of the low-pass filter 15 is switched in two steps. Two pump circuits 14F and 14S, for attaining a fast and a slow response time, respectively, are provided. The pump circuit 14S is comprised of an AND circuit $G_{41}$, and NAND circuit $G_{42}$, resistors $R_{41}$ and $R_{42}$, and diodes $D_{41}$ and $D_{42}$. The pump circuit 14F is comprised of an AND circuit $G_{43}$, a NAND circuit $G_{44}$, resistors $R_{43}$ and $R_{44}$, and diodes $D_{43}$ and $D_{44}$. Note that the AND circuits $G_{41}$ and $G_{43}$ and the NAND circuits $G_{42}$ and $G_{44}$ are open-collector type circuits. Further, the low-pass filter 15 is comprised of a capacitor C, two resistors $R_1$ and $R_2$, and a transistor $Q_1$.

A circuit formed by a resistor $R_{45}$, a diode $D_{45}$, and the transistor $Q_1$ is a means for determining whether or not the resistor $R_2$ is connected in parallel to the resistor $R_1$, depending on the control signal FAST. That is, when the potential of the control signal FAST is high, the resistor $R_2$ is connected in parallel to the resistor $R_1$, and, simultaneously, the pump circuit 14F is selected by the signal FAST. However, when the potential of the control signal FAST is low, the resistor $R_2$ is in a floating state, and, simultaneouly, the pump circuit 14S is selected by an inverter circuit $G_{45}$ which inverts the control signal FAST. Note that the resistor $R_1$ or the resistors $R_1$ and $R_2$ in combination correspond to the resistor $R_1$ of FIG. 3 while one of the resistors $R_{41}$ through $R_{44}$ corresponds to the resistor $R_0$ of FIG. 3.

Figure 5A:
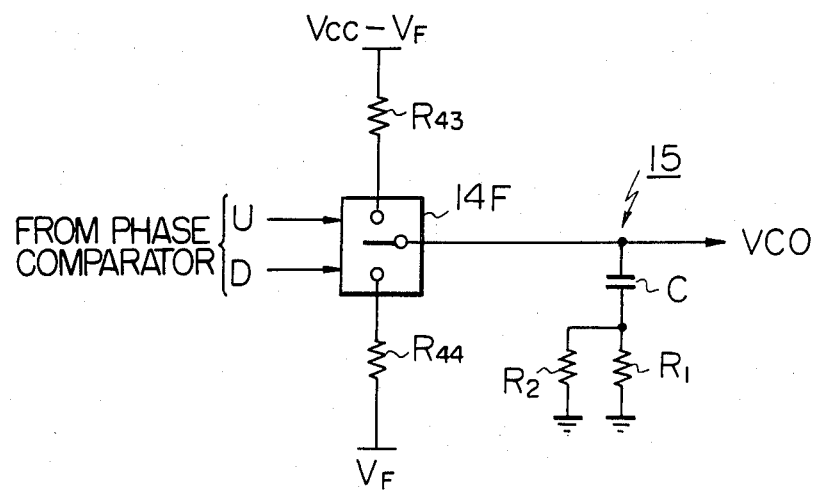
FIGS. 5A and 5B are equivalent circuit diagrams of the portion of the PLL circuit of FIG. 4 during the fast response mode.
Figure 5B:
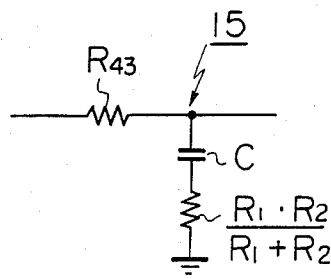
Figure 6A:
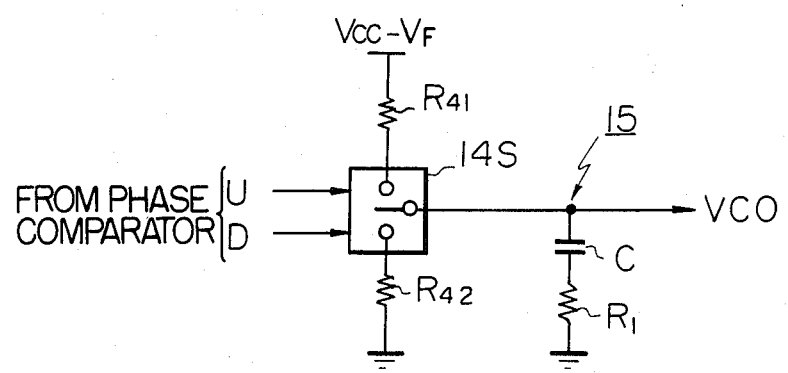
FIGS. 6A and 6B are equivalent circuit diagrams of the portion of the PLL circuit of FIG. 4 during the slow response mode.
Figure 6B:
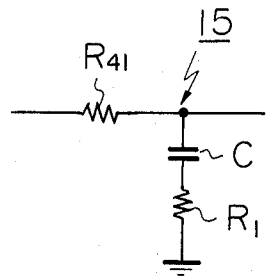

FIGS. 5A and 5B are equivalent circuit diagrams of the portion of the PLL circuit of FIG. 4 in which the potential of the control signal FAST is high so as to turn on the transistor $Q_1$. Particularly, FIG. 5B corresponds to a case where the potential of the pump-up output U is high. (If the potential of the pump-down output D is high, the resistor $R_{43}$ of FIG. 5B is replaced by the resistor $R_{44}$ of FIG. 5A.) On the other hand, FIGS. 6A and 6B are equivalent circuit diagrams of the portion of the PLL circuit of FIG. 4 in which the potential of the control signal FAST is low so as to cut off the transistor $Q_1$. Particularly, FIG. 6B corresponds to a case where the potential of the pump-up output U is high. (If the potential of the pump-down output D is high, the resistor $R_{41}$ of FIG. 6B is replaced by the resistor $R_{42}$ of FIG. 6A.) Note that $V_{CC}$ is the potential of a power supply and $V_F$ is the forward voltage of one of the diodes $D_{41}$ through $D_{44}$.

In the portion of the PLL circuit of FIG. 4, assume that $R_{41} = R_{42}$, $R_{43} = R_{44}$, and $R_{41} > R_{43}$. Of course, $R_1 > R_1 R_2 / (R_1 + R_2)$. When the potential of the control signal FAST is high, $\omega_n$ is so large as to enable a rapid lock-in operation. In addition, since $\xi$ can be suitably selected by the resistors $R_2$, $R_{41}$ ($=R_{42}$), and $R_{43}$ ($=R_{44}$) and, accordingly, can be definite during the lock-in mode and after the lock-in mode, the stability of the PLL circuit 1 cannot deteriorate.

In the portion of the PLL circuit of FIG. 4, however, since the resistor $R_2$ is connected in parallel to the resistor $R_1$ or is disconnected therefrom by using the switching transistor $Q_1$, there is a problem in that the saturated voltage of the transistor $Q_1$ is applied as noise to the control voltage of the voltage-controlled oscillator 11 during the lock-in mode, thereby deteriorating the lock-in characteristics of the PLL circuit 1.

According to the present invention, the cutoff frequency or time constant of the low-pass filter 15 is switched during the lock-in mode and after the lock-in mode, i.e., during the stationary mode, without using a switching transistor.

Figure 7:
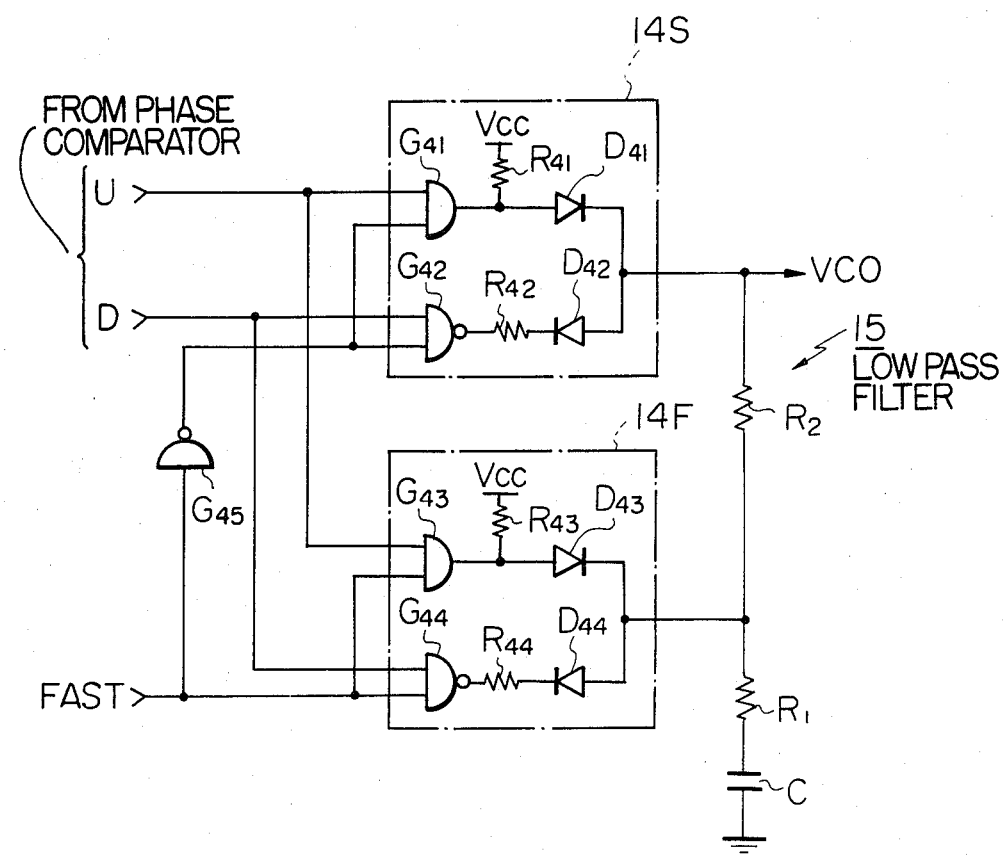
FIG. 7 is a circuit diagram of a first embodiment of a portion of a PLL circuit according to the present invention.

In FIG. 7, which is a first embodiment of the present invention, the resistor $R_2$ is connected in series to the resistor $R_1$. The transistor $Q_1$, the resistor $R_{45}$, and the diode $D_{45}$ of FIG. 4 are not included. The pump circuit 14F is connected to the resistor $R_1$, more precisely, to the connection point of the resistors $R_1$ and $R_2$, while the pump circuit 14S is connected to the resistor $R_2$. That is, there are the same number of pump circuits as there are resistors connected in series.

Figure 8A:
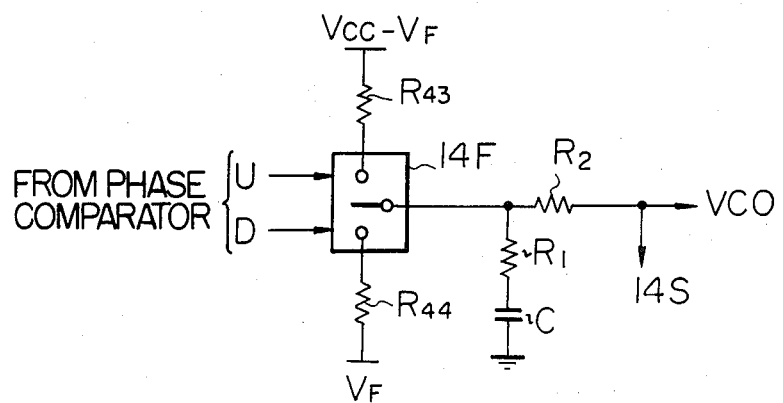
FIGS. 8A and 8B are equivalent circuit diagrams of the portion of the PLL circuit of FIG. 7 during the fast response mode.
Figure 8B:
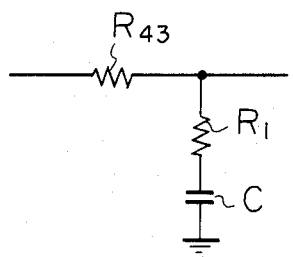

FIGS. 8A and 8B are equivalent circuit diagrams of the portion of the PLL circuit of FIG. 7 in which the potential of the control signal FAST is high. Particularly, FIG. 8B corresponds to a case where the potential of the pump-up output U is high. In this case, the pump circuit 14S is in an off state. In addition, the resistor $R_2$ is interposed between the resistor $R_1$ and the voltage-controlled oscillator 11. This resistor $R_2$, however, can be disregarded since the input impedance of the voltage-controlled oscillator 11 is high, i.e., 50 to 100 K$\Omega$, while the resistance value of the resistor $R_2$ is low, i.e., several hundred ohms($\Omega$). Also, in the PLL circuit of FIG. 8B, if the potential of the pump-down output D is high, the resistor $R_{43}$ is replaced by the resistor $R_{44}$ of FIG. 8A.

Figure 9A:
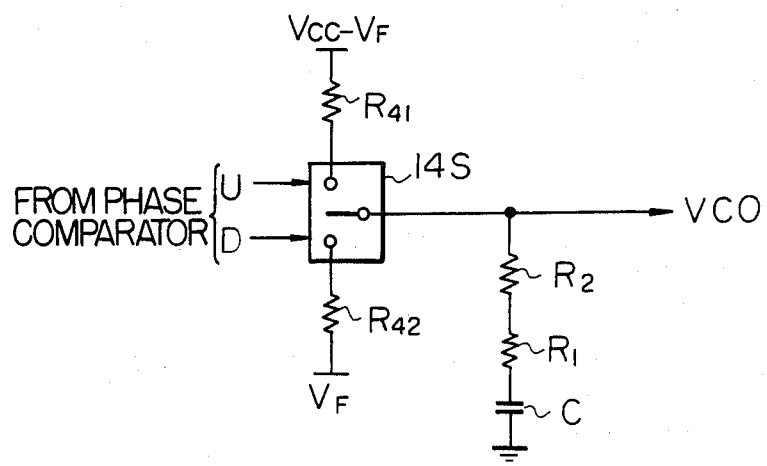
FIGS. 9A and 9B are equivalent circuit diagrams of the portion of the PLL circuit of FIG. 7 during the slow response mode.
Figure 9B:
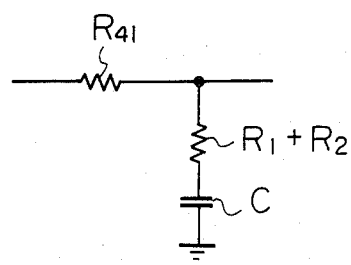

FIGS. 9A and 9B are equivalent circuit diagrams of the portion of the PLL circuit of FIG. 7 in which the potential of the control signal FAST is low. Particularly, FIG. 9B corresponds to a case where the potential of the pump-up output U is high. In this case, the pump circuit 14F is in an off state. In addition, the resistor $R_2$ is effectively connected in series with the resistor $R_1$.

In FIGS. 8B and 9B, $R_{41} > R_{43}$ and $R_1 > R_1 + R_2$, and, accordingly, the cutoff frequency or time constant of the low-pass filter 15, including the pump circuits, can be switched in the same manner as in FIG. 4. In addition, the values $\omega_n$ and $\xi$ can be selected as desired in a case where the control signal FAST is high or in a case where the control signal FAST is low. Therefore, the stability of the PLL 1 circuit never deteriorates. Further, since the cutoff frequency of the low-pass filter 15 is switched without using a switching transistor, the lock-in characteristics never deteriorate due to noise applied to the control voltage of the voltage-controlled oscillator during switching.

In FIG. 10, which is a second embodiment of the present invention, $G_{101}$, $G_{102}$, $G_{105}$ and $G_{106}$ are AND circuits; $G_{103}$, $G_{104}$, $G_{107}$ and $G_{108}$ are complementary metal-oxide semiconductor (CMOS) tri-state circuits; and $R_{101}$ through $R_{104}$ are resistors. That is, the NAND circuits $G_{42}$ and $G_{44}$ of FIG. 7 are replaced by the AND circuits $G_{102}$ and $G_{106}$, respectively, and the diodes $D_{41}$ through $D_{44}$ of FIG. 7 are replaced by the tri-state circuits $G_{103}$, $G_{104}$, $G_{107}$ and $G_{108}$, respectively. However, the circuits $G_{101}$ and $G_{105}$ and the resistors $R_{101}$ through $R_{104}$ correspond to the circuits $G_{41}$ and $G_{43}$ and the resistors $R_{41}$ through $R_{44}$, respectively, of FIG. 7.

In the second embodiment illustrated in FIG. 10, as compared with the first embodiment illustrated in FIG. 7, since diodes having nonlinear resistance characteristics are unnecessary, the cutoff frequency of the low-pass filter 15 is accurate. Accordingly, the cutoff frequency, if the pump-up output U is high, (i.e., the charging time constant of the low-pass filter 15 is large) is the same as the cutoff frequency if the pump-down output D is high (i.e., the discharging time constant of the low-pass filter 15 is large) when $R_{101} = R_{102}$ and $R_{103} = R_{104}$. This is helpful in stabilizing the lock-in operation of the PLL circuit 1. In addition, the entire device can be easily constructed with an integrated circuit.

Figure 11:
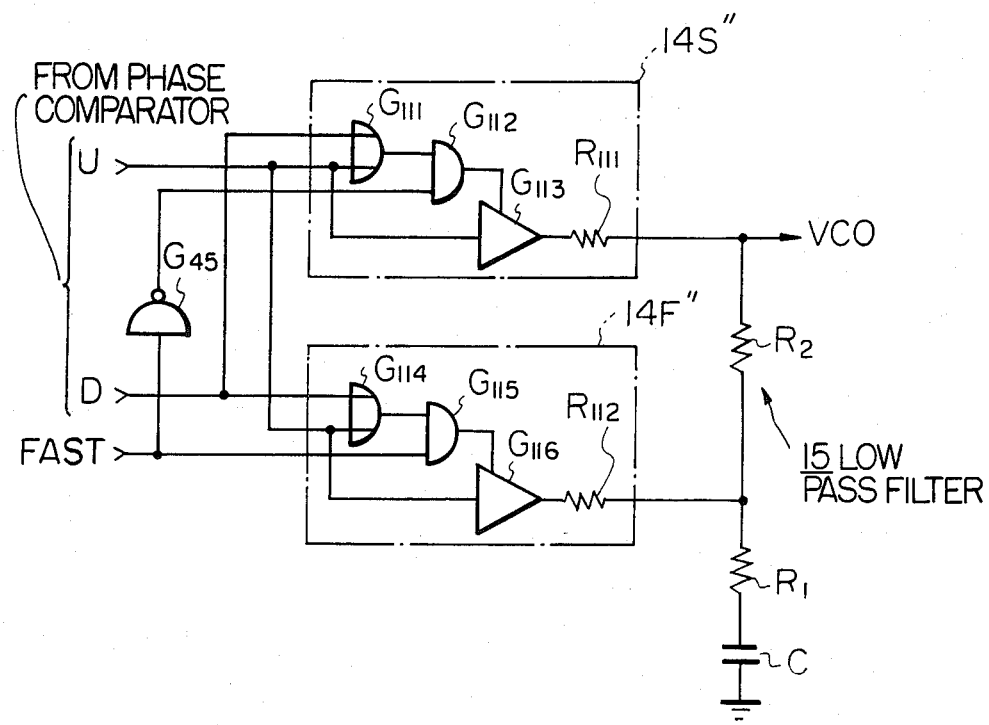
FIG. 11 is a circuit diagram of a third embodiment of a portion of a PLL circuit according to the present invention.

In FIG. 11, which is a third embodiment of the present invention, the charging time constant is made the same as the discharging time constant by using the single resistor per each pump circuit. A pump circuit 14S'' for achieving a slow response comprises an OR circuit $G_{111}$, an AND circuit $G_{112}$, a CMOS tri-state circuit $G_{113}$, and a resistor $R_{111}$. A pump circuit 14 F'' for achieving a fast response comprises an OR circuit $G_{114}$, an AND circuit $G_{115}$, a CMOS tri-state circuit $G_{116}$, and a resistor $R_{112}$.

Figure 12:
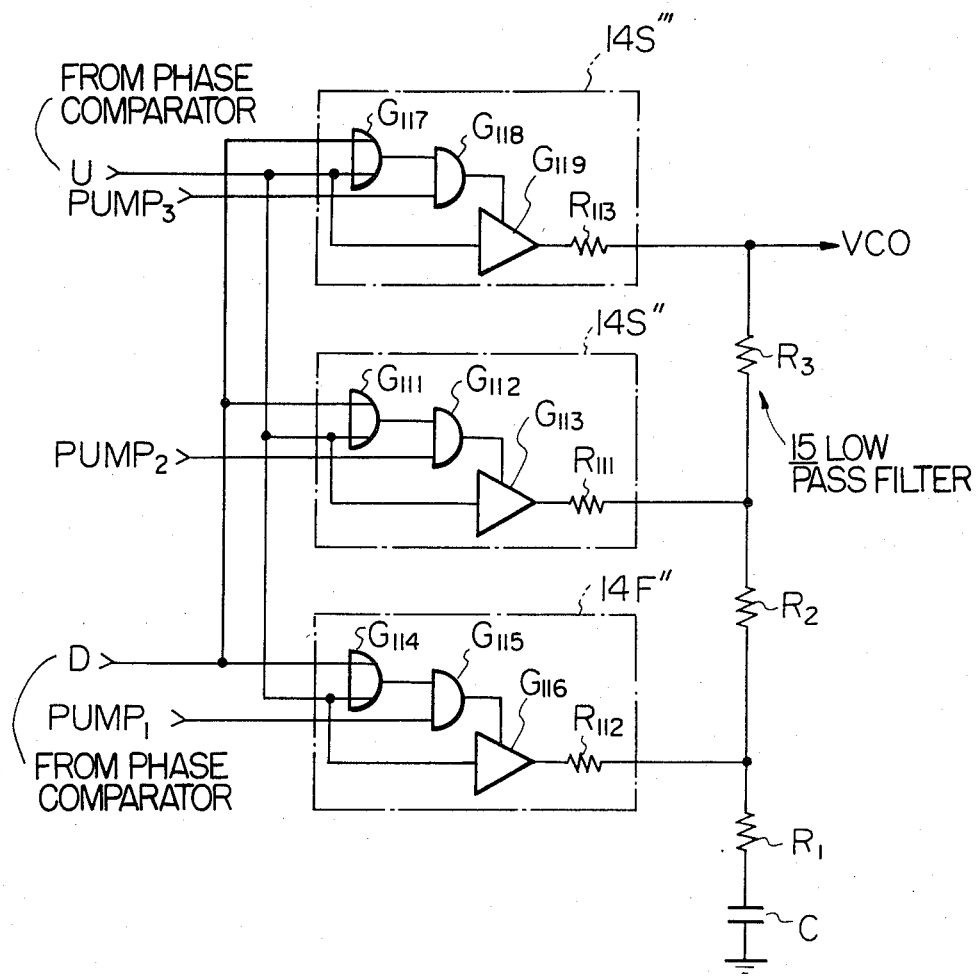
FIG. 12 is a circuit diagram of a fourth embodiment of a portion of a PLL circuit according to the present invention.

In the above-mentioned embodiments illustrated in FIGS. 7, 10, and 11, the time constant of the low-pass filter is switched in two steps. However, the time constant of the low-pass filter can be switched in more than three steps, thereby smoothly changing the time constant. In FIG. 12, a pump circuit 14S''', which is the same as the pump circuits 14S'' and 14F'' of FIG. 11, is added to the PLL circuit, and a resistor $R_3$ is also added. Only one of the pump circuits 14F'', 14S'', and 14S''' is selected by selection signals PUMP$_1$ through PUMP$_3$. By developing such a circuit configuration, it is possible to switch the time constant of the low-pass filter multi-steps, i.e., in more than four steps, thereby more smoothly changing the time constant.

As is explained above, according to the present invention, since the time constant of the low-pass filter in a PLL circuit is switched without using a switching transistor, the lock-in characteristics of the PLL circuit according to the present invention never deteriorate due to noise applied to the control voltage of the voltage-controlled oscillator during switching.

I claim:

1. A phase-locked loop circuit operatively connected to receive an input signal and operatively connected to a constant voltage source, comprising;
   a voltage-controlled oscillator having an input terminal and generating, at an output terminal, an output signal having an output frequency;
   a phase comparator, operatively connected to the output terminal of said voltage-controlled oscillator and operatively connected to receive the input signal, for generating a pump-up output signal or a pump-down output signal in dependence upon whether the input signal leads or lags the output signal of said voltage-controlled oscillator;
   a low-pass filter, operatively connected to said input terminal of said voltage-controlled oscillator, for generating a control voltage for controlling the output frequency of said voltage-controlled oscillator, said low-pass filter comprising:
      a capacitor having one terminal connected to ground; and
      a plurality of resistors operatively connected in series between the other terminal of said capacitor and said input terminal of said voltage-controlled oscillator;
   a plurality of pump circuits, each operatively connected to said phase comparator and to one of said plurality of resistors of said low-pass filter, for charging or discharging said capacitor in said low-pass filter through the constant voltage source upon receipt of the pump-up output signal or the pump-down output signal, respectively, from said phase comparator, each of said pump circuits including:
- a first power supply terminal;
- a second power supply terminal, the potential of said second power supply terminal being lower than that of said first power supply terminal;
- a first AND circuit, operatively connected to said phase comparator, having a first input for receiving the pump-up output signal from said phase comparator, having a second input terminal and having an output terminal;
- a second AND circuit, operatively connected to said phase comparator and said selecting means, having a first input for receiving the pump-down output signal from said phase comparator, having a second input terminal and having an output terminal, said second input terminal of said first and second AND circuits being commonly controlled by said selecting means;
- a first tri-state circuit having an input terminal operatively connected to said first power supply terminal, having a control terminal operatively connected to said output terminal of said first AND circuit, and having an output terminal;
- a second tri-state circuit having an input terminal operatively connected to said second power supply terminal, having a control terminal operatively connected to said output terminal of said second AND circuit, and having an output terminal;
- a first resistor operatively connected to said output terminal of said first tri-state circuit; and
- a second resistor operatively connected to said output terminal of said second tri-state circuit, said first and second resistors being commonly connected to one of said plurality of resistors of said low-pass filter; and selecting means, operatively connected to said pump circuits for selecting one of said plurality of pump circuits.

2. A circuit as set forth in claim 1, further comprising a frequency divider, operatively connected between said voltage-controlled oscillator and said phase comparator, for dividing the output frequency of said voltage-controlled oscillator.

3. A phase-locked loop circuit operatively connected to receive an input signal and operatively connected to a constant voltage source, comprising:
- a voltage-controlled oscillator having an input terminal and generating, at an output terminal, an output signal having an output frequency;
- a phase comparator, operatively connected to the output terminal of said voltage-controlled oscillator and operatively connected to receive the input signal, for generating a pump-up output signal or a pump-down output signal in dependence upon whether the input signal leads or lags the output signal of said voltage-controlled oscillator;
- a low-pass filter, operatively connected to said input terminal of said voltage-controlled oscillator, for generating a control voltage for controlling the output frequency of said voltage-controlled oscillator, said low-pass filter comprising:
  - a capacitor having one terminal connected to ground; and
  - a plurality of resistors operatively connected in series between the other terminal of said capacitor and said input terminal of said voltage-controlled oscillator;
- a plurality of pump circuits, each operatively connected to said phase comparator and to one of said plurality of resistors of said low-pass filter, for charging or discharging said capacitor in said low-pass filter through the constant voltage source upon receipt of the pump-up output signal or the pump-down output signal, respectively, from said phase comparator, each of said pump circuits including:
  - a first power supply terminal;
  - a second power supply terminal, the potential of said second power supply terminal being lower than that of said first power supply terminal;
  - an OR circuit, operatively connected to said phase comparator, having a first input terminal for receiving the pump-down output signal from said phase comparator, having a second input terminal for receiving the pump-up output signal from said phase comparator and having an output terminal;
  - an AND circuit having a first input terminal operatively connected to said output terminal of said OR circuit, having a second input terminal and having an output terminal, said second input terminal of said AND circuit being controlled by said selecting means;
  - a tri-state circuit, operatively connected to said phase comparator, having an input terminal for receiving the pump-up output signal from said phase comparator, having a control terminal operatively connected to said output terminal of said AND circuit and having an output terminal; and
  - a resistor operatively connected to said output terminal of said tri-state circuit and to one of said plurality of resistors of said low-pass filter; and
selecting means, operatively connected to said plurality of pump circuits, for selecting one of said plurality of pump circuits.

4. A circuit as set forth in claim 3, further comprising a frequency divider, operatively connected between said voltage controlled oscillator and said phase comparator, for dividing the output frequency of said voltage controlled oscillator.

* * * * *